United States Patent [19]
Tomita et al.

[11] Patent Number: 5,817,174
[45] Date of Patent: Oct. 6, 1998

[54] SEMICONDUCTOR SUBSTRATE AND METHOD OF TREATING SEMICONDUCTOR SUBSTRATE

[75] Inventors: Hiroshi Tomita; Mami Takahashi, both of Yokohama, Japan

[73] Assignee: Kabushiki Kaisha Toshiba, Kawasaki, Japan

[21] Appl. No.: 764,591

[22] Filed: Dec. 13, 1996

[30] Foreign Application Priority Data

Dec. 15, 1995 [JP] Japan .................................... 7-327578

[51] Int. Cl.$^6$ .................................................. C30B 33/08
[52] U.S. Cl. .............................. 117/97; 117/94; 117/106; 117/913; 438/924; 438/694
[58] Field of Search ................... 117/94, 97, 3, 117/7, 9, 106, 90, 913, 935; 438/924, 694, 706, 906

[56] References Cited

U.S. PATENT DOCUMENTS

| | | | |
|---|---|---|---|
| 3,511,727 | 5/1970 | Hays | 117/97 |
| 5,173,152 | 12/1992 | Tamaka | 156/646 |
| 5,380,677 | 1/1995 | Eakin | 437/106 |
| 5,508,226 | 4/1996 | Ito | 117/7 |

FOREIGN PATENT DOCUMENTS

| | | |
|---|---|---|
| 59-162200 | 9/1984 | Japan . |
| 2-225399 | 9/1990 | Japan . |
| 3-80536 | 4/1991 | Japan . |
| 3-110831 | 5/1991 | Japan . |

*Primary Examiner*—Robert Kunemund
*Assistant Examiner*—Evelyn Defilló
*Attorney, Agent, or Firm*—Oblon, Spivak, McClelland, Maier & Neustadt, P.C.

[57] ABSTRACT

A method of treating a semiconductor substrate, which comprises the steps of subjecting a surface of the semiconductor substrate to an annealing treatment, performing an etching treatment of the surface of the semiconductor substrate under a condition where the semiconductor substrate is substantially prevented from being etched and a precipitate exposed from the surface of the semiconductor substrate is selectively etched away, and forming a monocrystalline film of a semiconductor material constituting the semiconductor substrate on the surface of the semiconductor substrate.

19 Claims, 6 Drawing Sheets

SEMICONDUCTOR SUBSTRATE AND METHOD OF TREATING SEMICONDUCTOR SUBSTRATE

BACKGROUND OF THE INVENTION

This invention relates to a semiconductor substrate, and a method of treating a semiconductor substrate.

Nowadays, a large scale integrated circuit (LSI) has been extensively utilized in the important portion of a computer and of a communication device. A monocrystalline silicon substrate (or silicon wafer) to be employed in the preparation of the LSI can be produced by means of Czochralski method (CZ method) for instance.

The silicon substrate prepared by means of this CZ method (a CZ silicon substrate) is however accompanied with a problem that a large number of oxygen precipitates (Bulk Micro Defect: BMD) are caused to be formed on the surface or interior of the silicon substrate. It is believed that the formation of BMD is brought about by the oxygen which is eluted at first from a quartz crucible in the process of pulling up a silicon monocrystal and, after being supersaturated in the silicon substrate, precipitated in the silicon substrate during the heat-treatment process of the silicon substrate. Because of this, the BMD is assumed to be formed of a compound consisted of oxygen and silicon (i.e. SiOx). Furthermore, it is assumed that there are two cases in the precipitation state of the BMD, i.e. one of the cases is that the BMD is precipitated on the inner surface of the voids (hole) of the silicon substrate, and the other is that the BMD is precipitated to completely fill the voids of the silicon substrate.

It is reported that the reliability of a thermal oxide film that will be formed by the thermal oxidation of the surface of a silicon substrate has something to do with the density of BMD on the surface portion of the silicon substrate. Specifically, when a silicon substrate having a high BMD density at the surface portion thereof is employed, a breakdown voltage of a capacitor gate oxide film will be decreased (random failure).

In order to remedy the failure in breakdown voltage of this kind, the following two countermeasures have been conventionally adopted.

Namely, one of such countermeasures is to anneal the silicon substrate at a high temperature of about 1,200° C. in an inert gas atmosphere such as hydrogen gas or argon gas. When the silicon substrate is annealed at such a high temperature, the oxygen existing at the surface portion of the silicon substrate is diffused out of the silicon substrate and at the same time the BMD in the silicon monocrystal is re-solubilized as a solid-solution at a surface region, i.e. extending from the surface of the silicon substrate to a depth of about 50 μm, thereby forming a defect-free layer, or a layer of DZ (Denuded Zone).

If a silicon oxide film is formed through a thermal oxidation on the surface of this silicon substrate provided with such a DZ layer (hereinafter referred to as a DZ silicon substrate), the percent defective in breakdown voltage can be extremely reduced.

The other of such countermeasures is to employ a silicon substrate on which an epitaxial silicon film is formed in advance (hereinafter referred to as an epitaxial silicon substrate). Since oxygen is not intentionally added to this epitaxial silicon substrate in general, the epitaxial silicon film constituting the surface of the substrate is free from the formation of BMD.

Therefore, when a silicon oxide film is formed through a thermal oxidation on the surface of this epitaxial silicon substrate, the percent defective in breakdown voltage can be extremely reduced as compared with an untreated CZ silicon substrate as in the case where a silicon oxide film is formed on a DZ silicon substrate.

However, even if it may be possible to remedy the defect in breakdown voltage of the oxide film, the wear-out life (intrinsic failure) of the oxide film can not be improved, but would be left remained at substantially the same level as that of an untreated CZ silicon substrate.

Because of these reasons, the silicon oxide film formed on the CZ silicon substrate treated in advance with any of the aforementioned countermeasures is still accompanied with a problem that it is insufficient for use as a tunnel gate oxide film for an EEPROM, since the tunnel gate oxide film would be exposed to a Fowler-Nordheim type current stress of high electric field and therefore is desired to have a long dielectric breakdown life.

As explained above, the employment of a conventional silicon substrate which is provided with the DZ layer or with an epitaxial layer is accompanied with the problem that even if the random failure of a silicon oxide film may be overcome, the intrinsic failure cannot be overcome.

BRIEF SUMMARY OF THE INVENTION

Accordingly, an object of the present invention is to provide a method of treating a semiconductor substrate, which makes it possible to effectively minimize the micro defects of the surface of the semiconductor substrate on which a semiconductor monocrystalline film is formed, thereby allowing an insulating film having an improved dielectric breakdown life to be formed on the surface of the substrate.

Another object of this invention is to provide a semiconductor device which is formed by making use of the aforementioned substrate.

Namely, according to the present invention, there is provided a method of treating a semiconductor substrate, which comprises the steps of:

performing an etching treatment of a surface of the semiconductor substrate under a condition where the semiconductor substrate is substantially prevented from being etched and only a precipitate exposed from the surface of the semiconductor substrate is etched away; and forming a monocrystalline film of a semiconductor material constituting the semiconductor substrate on the surface of the semiconductor substrate.

According to the present invention, there is further provided a method of treating a semiconductor substrate, which comprises the steps of:

subjecting a surface of the semiconductor substrate to a first annealing treatment;

performing an etching treatment of the surface of the semiconductor substrate under a condition where the semiconductor substrate is substantially prevented from being etched and only a precipitate exposed from the surface of the semiconductor substrate is etched away; and forming a monocrystalline film of a semiconductor material constituting the semiconductor substrate on the surface of the semiconductor substrate.

Further, according to the present invention, there is also provided a semiconductor device, which comprises a semiconductor underlying substrate; and a monocrystalline film of a semiconductor material constituting the semiconductor underlying substrate formed on the surface of the semiconductor underlying substrate;

wherein said semiconductor underlying substrate comprises a region containing fluorine atoms at a density of $10^{10}$ atoms/cm$^2$ or more, on an entire interface between said semiconductor underlying substrate and said monocrystalline film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The method according to this invention can be fundamentally performed according to the following principle.

Namely, first of all, the surface of a semiconductor substrate on which an epitaxial growth will be subsequently taken place is subjected to an etching treatment under a condition where the semiconductor substrate is substantially prevented from being etched and only a precipitate exposed from the surface of the semiconductor substrate is etched away. Thereafter, the epitaxial growth of a semiconductor material is carried out on this etched surface of the semiconductor substrate. As a result, a monocrystalline semiconductor layer having a flat surface can be obtained. A thermal gate oxide film having an improved charge to dielectric breakdown and a high breakdown voltage of MOS capacitor can be formed on the monocrystalline semiconductor layer.

The method of this invention can be classified into the following four embodiments. These four embodiments will be explained as follows.

(1). Selective etching plus Epitaxial growth

As mentioned above, the surface of a semiconductor substrate is subjected to an etching treatment under a condition where the semiconductor substrate is substantially prevented from being etched and only a precipitate exposed from the surface of the semiconductor substrate is selectively etched away. Thereafter, the epitaxial growth of a semiconductor material is carried out on this etched surface of the semiconductor substrate.

This selective etching may be performed by using a solution or a gas.

The practical conditions for this selective etching and epitaxial growth are as follows.

Selective etching A (a solution):

Temperature: room temperature,

Time: 1 to 30 minutes,

Atmosphere: a dilute aqueous solution of hydrofluoric acid having a concentration of 0.2 to 10%;

Selective etching B (a gas):

Temperature: room temperature to 90° C.,

Time: 1 to 60 minutes,

Atmosphere: a mixed gas comprising an HF gas and water vapor, the concentration of HF gas being 37.7%;

Epitaxial growth:

Temperature: 600° C. or more,

Time: 2 to 100 minutes,

Atmosphere: an $Si_2H_6$ gas, a reduced pressure.

(2). Selective etching plus Annealing plus Epitaxial growth

The surface of a semiconductor substrate is subjected to an etching treatment under a condition where the semiconductor substrate is substantially prevented from being etched and only a precipitate exposed from the surface of the semiconductor substrate is selectively etched away. Thereafter, the resultant semiconductor substrate is subjected to an annealing as a pre-treatment for the epitaxial growth, thereby removing the natural oxide film formed on the surface of the semiconductor substrate and at the same time causing the migration of semiconductor atoms in the surface portion to occur whereby burying the concaves formed after the removal of the precipitates, thus flattening the surface of the semiconductor substrate. Subsequently, the epitaxial growth of a semiconductor material is carried out on this flattened surface of the semiconductor substrate.

The conditions for the selective etching, annealing and epitaxial growth are as follows.

Selective etching

The same as mentioned above in (1);

Annealing

Temperature: 850° C. or more,

Time: until the natural oxide is completely removed (the end point being observed), Atmosphere: a reduced pressure, the partial pressure of oxygen being $2.0\times10^{12}\exp(-3.83/kT)$ or less wherein k means the Boltzmann constant and T is the absolute temperature.

Epitaxial growth

The same as mentioned above in (1).

(3). Annealing plus Selective etching plus Epitaxial growth

The semiconductor substrate is subjected to an annealing, whereby reducing the oxygen precipitates in size, to 0.1 μm or less for instance. Then, the surface of a semiconductor substrate is subjected to an etching treatment under a condition where the semiconductor substrate is substantially prevented from being etched and only a precipitate exposed from the surface of the semiconductor substrate and reduced in size by the annealing treatment is selectively etched away. Thereafter, the epitaxial growth of a semiconductor material is carried out on this etched surface of the semiconductor substrate.

The annealing may be either a normal pressure/high temperature annealing or a reduced pressure/high temperature annealing.

The conditions for the annealing, selective etching and epitaxial growth are as follows.

A normal pressure/high temperature annealing:

Temperature: 850° C. or more, preferably 1,000° C. or more,

Time: 1 to 60 minutes,

Atmosphere: a non-oxidizing atmosphere (hydrogen gas and/or an inert gas), atmospheric pressure. Preferred inert gas is a rare gas such as Ar and so on.

A reduced pressure/high temperature annealing:

Temperature: 850° C. or more, preferably 1,000° C. or more,

Time: 1 to 60 minutes,

Atmosphere: a reduced pressure, the partial pressure of oxygen being $2.0\times10^{12}\exp(-3.83/kT)$ or less wherein k is the Boltzmann constant and T is the absolute temperature.

Selective etching

The same as mentioned above in (1);

Epitaxial growth

The same as mentioned above in (1).

(4). Annealing plus Selective etching plus Annealing plus Epitaxial growth

The semiconductor substrate is subjected to an annealing, whereby reducing the oxygen precipitates in size, to 0.1 μm or less for instance. Then, the surface of a semiconductor substrate is subjected to an etching treatment under a condition where the semiconductor substrate is substantially prevented from being etched and only a precipitate exposed from the surface of the semiconductor substrate and reduced in size by the annealing treatment is selectively etched away. Thereafter, the resultant semiconductor substrate is subjected to an annealing as a pre-treatment for the epitaxial growth, thereby removing the natural oxide film formed on the surface of the semiconductor substrate and at the same time causing the migration of semiconductor atoms in the surface portion to occur whereby burying the concaves formed after the removal of the precipitates, thus flattening the surface of the semiconductor substrate. Subsequently, the epitaxial growth of a semiconductor material is carried out on this flattened surface of the semiconductor substrate.

The conditions for the annealing, selective etching and epitaxial growth are the same as mentioned above in (1), (2) and (3).

This invention will be further explained below with reference to drawings depicting various embodiments of this invention.

EXAMPLE 1

Figure 1A:
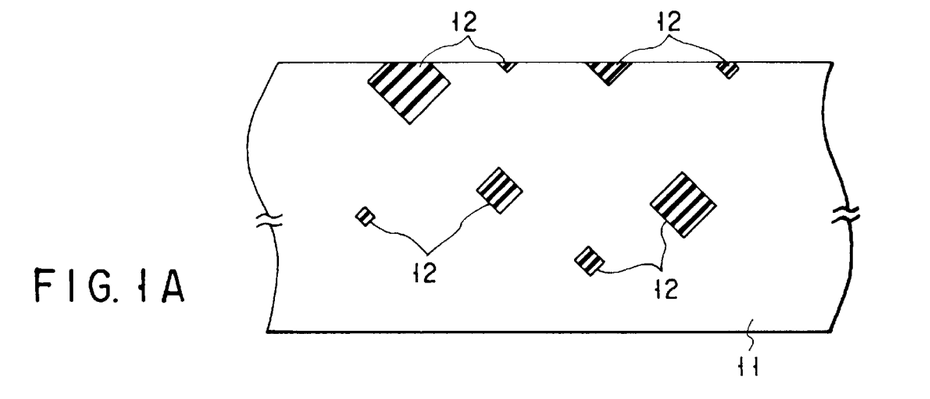
FIGS. 1A to 1C are cross-sectional views showing a process of treating a semiconductor substrate according to a first example of this invention.
Figure 1B:
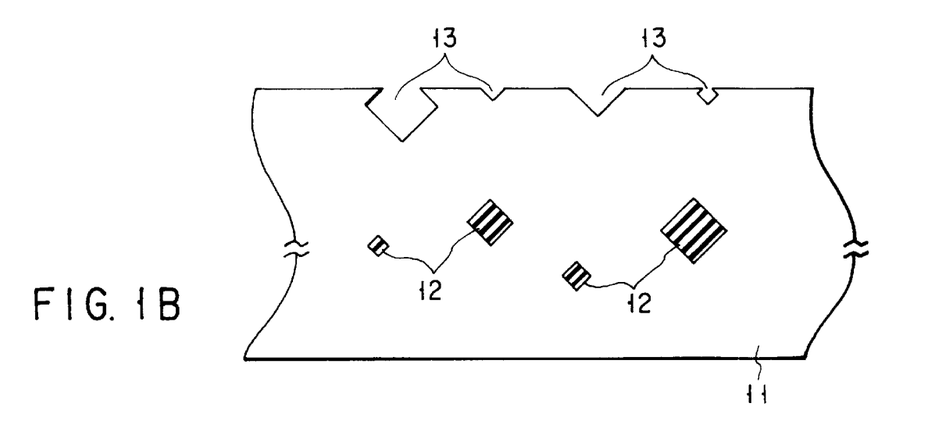
Figure 1C:
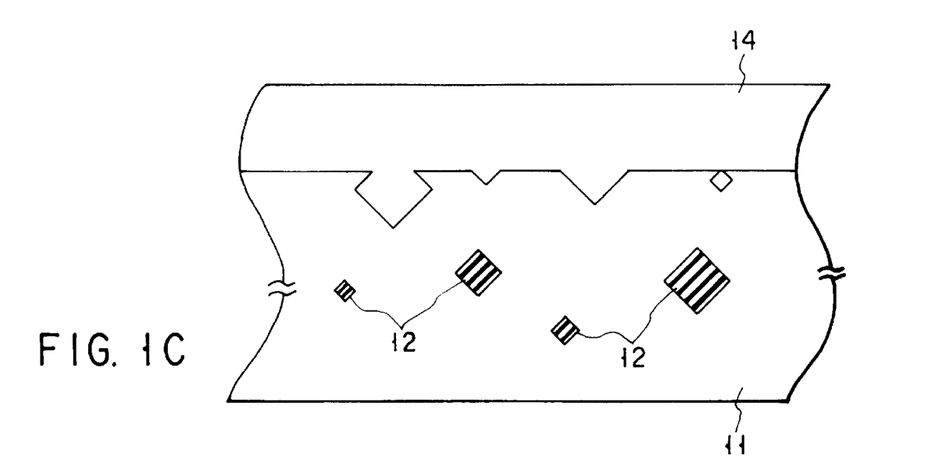

FIGS. 1A to 1C are cross-sectional views illustrating a process of treating a semiconductor substrate according to a first example of this invention.

First of all, as shown in FIG. 1A, a silicon substrate 11 is prepared from a silicon bulk having an oxygen concentration of about $1.3\times10^{18}$ to $1.5\times10^{18}$ atoms/cm$^3$ and manufactured by means of the Czochralski method. At this stage, the density of BMD 12 at the surface region of the silicon 11 is still as high as the conventional one.

Then, as shown in FIG. 1B, the surface of the silicon 11 is subjected to an etching treatment for about 30 minutes by making use for instance of a 3% HF aqueous solution. At this moment, the BMDs 12 which have been precipitated and exposed from the surface of the silicon substrate 11 is selectively etched away by HF, whereby forming concaves 13 on the surface of the silicon substrate 11. It should be noted that these concaves 13 are free from any kind of precipitates and of course from the BMD 12.

The diameter of the concave 13 is at most about 0.2 to 0.5 μm or more. The depth of the concave 13 is at most about 0.2 to 0.5 μm or more. Therefore, if an HF aqueous solution of about 3% concentration is employed for selectively removing the BMD 12 exposed on the surface of the silicon substrate 11 without excessively etching the silicon substrate 11, at least 20 minutes of treatment time would be required in view of the etching rate of the BMD 12. If an HF aqueous solution of less than 3% concentration is employed for selectively removing the BMD 12, the etching treatment may be prolonged by about 10 times.

Figure 2:
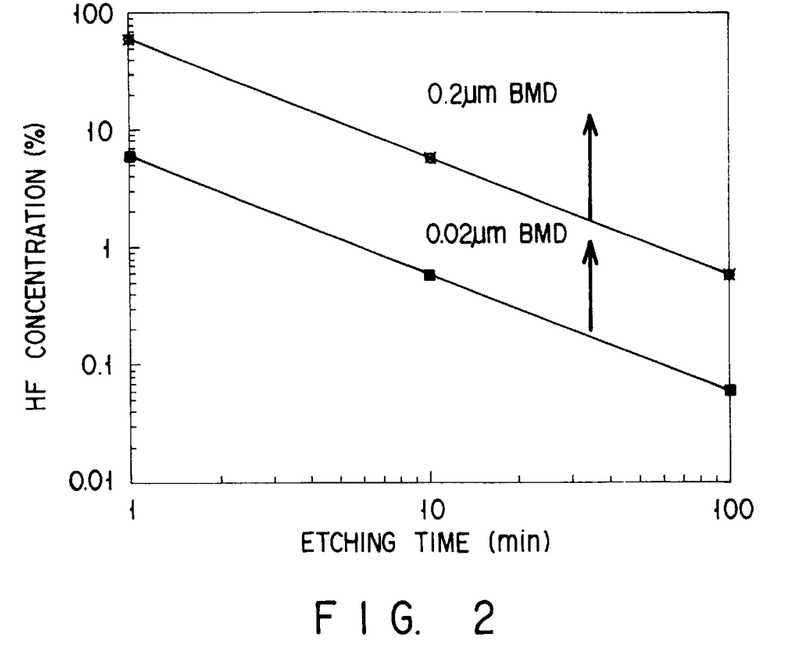
FIG. 2 is a graph showing a relationship between the concentration of a dilute aqueous solution of hydrofluoric acid to be employed for selectively etching a silicon substrate and the etching time.

FIG. 2 illustrates a relationship between the concentration of a dilute aqueous solution of hydrofluoric acid employed for selectively etching away the BMD existing on the surface of silicon substrate and the etching time. The etching time in this case is dependent upon the size of the BMD. Accordingly, the etching time of the cases where two kinds of the BMD, i.e. 0.2 μm and 0.02 μm in size are employed is shown in FIG. 2. In any of these experiments on the BMD, oxygen precipitates are not formed on the inner wall of the void, but the void is completely buried with oxygen precipitates. When the void is completely buried with oxygen precipitates (BMD), a longer etching time and a higher concentration in the HF aqueous solution will be required as compared with the case where oxygen precipitates (BMD) are formed on the inner wall of the void.

The treatment of silicon substrate with a dilute aqueous solution of hydrofluoric acid before the deposition of an epitaxial silicon film has been conventionally performed. However, this conventional treatment with a dilute aqueous solution of hydrofluoric acid has been performed not for the purpose of removing all of oxygen precipitates as in the case of this invention, but only for the purpose of removing a natural oxide film which has been spontaneously formed on the surface of the silicon substrate. Usually, the surface of a silicon substrate is covered with a natural oxide film 1 to 2 nm or less in thickness, so that the conventional treatment with a dilute aqueous solution of hydrofluoric acid on a silicon substrate has been performed for a time period and with a concentration of hydrofluoric acid which are only sufficient to remove a natural oxide film of such a film thickness.

Then, as shown in FIG. 1C, an epitaxial silicon film 14 having a film thickness of about 2 μm is formed on the surface of the silicon substrate 11.

In this occasion, since the concave 13 is free from any precipitate, the epitaxial growth of silicon is taken place even inside the concave 13. Accordingly, the concave 13 is filled with silicon and hence the surface of the resultant epitaxial silicon film 14 thus formed is free from unevenness, thus making it possible to obtain the epitaxial silicon film 14 having a flat surface.

Fluorine atoms are present on an interface between the silicon substrate 11 and the epitaxial silicon film 14. The density of the fluorine atoms on the entire interface may be $1 \times 10^{10}$ to $3 \times 10^{12}$ atoms/cm$^2$, preferably, $1 \times 10^{11}$ to $3 \times 10^{12}$ atoms/cm$^2$, for example $1 \times 10^{12}$ atoms/cm$^2$, measured by SIMS (Secondary Ion Mass spectroscopy) method. When the density of the fluorine atoms exceeds $3 \times 10^{12}$ atoms/cm$^2$, it may be difficult to perform an epitaxial growth on the silicon substrate.

Finally, a silicon oxide film is formed on the epitaxial silicon film 14 to obtain a desired semiconductor device.

According to this example, since the BMD which is a cause for deteriorating the charge to dielectric breakdown of silicon oxide film is not exposed from the surface of the substrate, the charge to dielectric breakdown of the silicon oxide film formed on the epitaxial silicon film 14 will be improved. Furthermore, since a CZ silicon substrate 11 employed as a substrate in this case has been subjected in advance to a treatment for improving the random failure life of the substrate 11 as in the case of the conventional substrate, the random failure life of the substrate 11 will be also improved.

Figure 3:
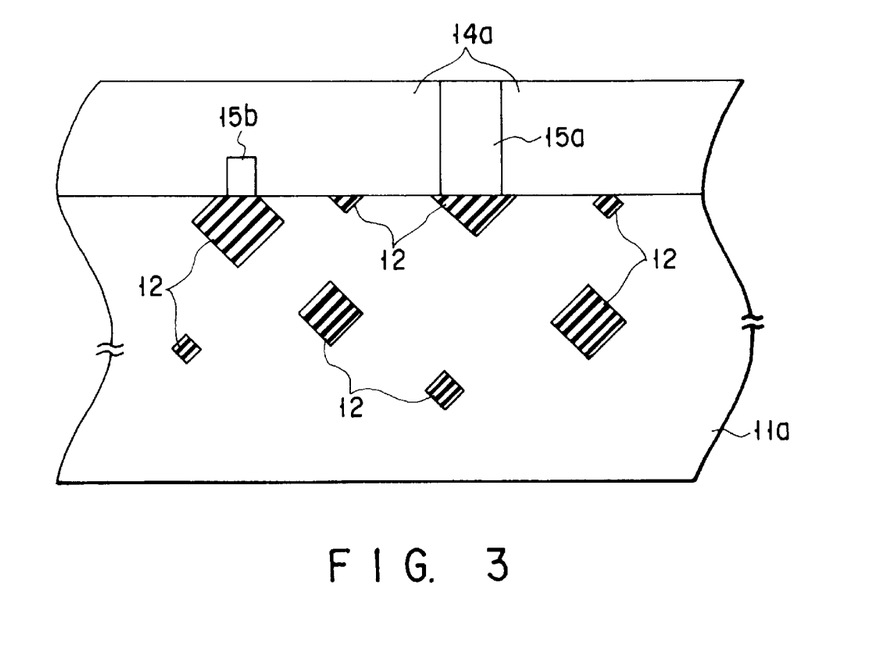
FIG. 3 is a cross-sectional view showing a state where an epitaxial silicon film is formed on a conventional untreated CZ silicon substrate.

FIG. 3 is a cross-sectional view of a conventional untreated CZ silicon substrate 11a on which an epitaxial silicon film 14a is formed.

A silicon substrate has been conventionally treated with a dilute aqueous solution of hydrofluoric acid before the deposition of an epitaxial silicon film 14a as mentioned above. However, since the purpose of this conventional treatment with a dilute aqueous solution of hydrofluoric acid is merely to remove a natural oxide film which has been spontaneously formed on the surface of the silicon substrate, there has been no attempt or no proposal to treat, under an optimum condition, a silicon substrate with a view to etch away the BMDs 12 which have been precipitated and exposed from the surface of the substrate. Therefore, according to this conventional technique, the epitaxial growth would hardly take place right upon the BMDs 12 which have been exposed from the surface of substrate, but only a polycrystalline silicon film 15a or a polycrystalline silicon grain 15b is formed upon surfaces of the BMDs 12 instead. In this case, the polycrystalline silicon grain 15b is considered to act as a laser scattering medium.

Figure 4:
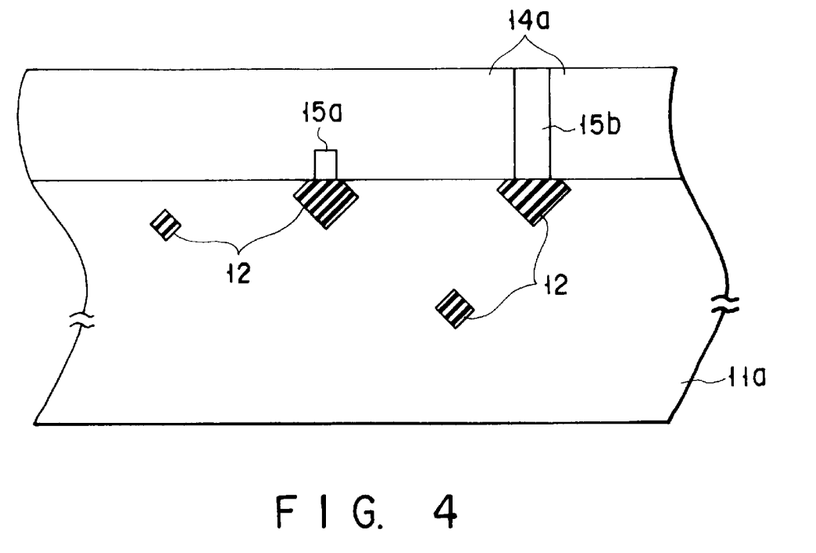
FIG. 4 is a cross-sectional view showing a state where an epitaxial silicon film is formed on another kind of conventional untreated CZ silicon substrate.

FIG. 4 is a cross-sectional view of another untreated CZ silicon substrate 11a on which an epitaxial silicon film 14a is formed according to the conventional method.

Namely, FIG. 4 illustrates a cross-section of the CZ silicon substrate 11a which has been subjected to a dry cleaning treatment with an HCl gas or a hydrogen gas at a high temperature of about 1,200° C. before an epitaxial silicon film 14a is deposited thereon and after the substrate 11a has been treated in advance with HF as in the case of FIG. 3. In this case, the surface of silicon substrate 11a is etched by this dry cleaning treatment. For example, when the substrate 11a is subjected to a dry cleaning of as short as several minutes, the surface layer corresponding in thickness to several atoms or more of the silicon substrate 11a will be etched away.

Therefore, even if the BMDs that have been exposed on the surface of the silicon substrate 11a can be removed by means of the HF treatment before the step of dry cleaning, the surface of the silicon substrate 11a is also etched by the dry cleaning process thereby allowing new BMDs 12 to be exposed from the surface of the substrate 11a.

In view of this, in this example, a dry cleaning of such a high intensity that may accompany an etching of the silicon substrate 11a is not performed immediately before the deposition of the epitaxial silicon film 14a, but a dry cleaning of such a weak intensity that is sufficient enough to remove only a natural oxide film that has been re-produced on the surface of the silicon substrate 11a is performed.

Figure 5:
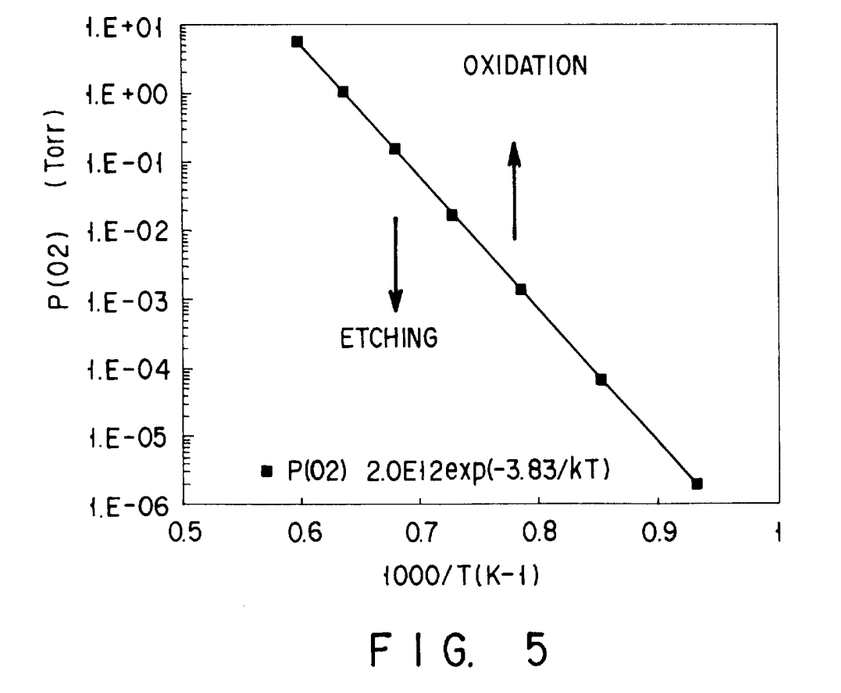
FIG. 5 is a graph showing a relationship between an annealing temperature and an oxygen partial pressure, explaining annealing conditions.

This weak dry cleaning should preferably be performed under a condition of etching mode as shown in FIG. 5 (in an inert gas atmosphere of 850° C. or more). When the dry cleaning is performed under such a condition, it is possible to remove only the natural oxide film produced on the surface of a silicon substrate. In particular, since the etching of the silicon substrate 11a per se should desirably be avoided, it is fundamentally desirable to observe the decomposed material, i.e. SiO (mass number: 44) which will be resulted from the etching of the natural oxide film (SiO$_2$) by making use of a mass spectrograph, and to watch the process of removal of the natural oxide from the substrate, thereby to detect the end point indicating the finish of the removal of the natural oxide. Usually, the etching of the natural oxide film can be monitored by controlling the etching time.

The gas atmosphere for the annealing of the silicon substrate 11a is not limited to the aforementioned inert gas atmosphere but may be other kinds of gas atmosphere such as hydrogen gas provided that the annealing can be performed under a condition where the etching of the silicon substrate 11a would not substantially take place.

Preferably, the epitaxial silicon film 14a should be grown after the removal of the BMD 12 that has been precipitated on the surface of the substrate 11a without performing the dry etching, i.e. without allowing a natural oxide film to be re-grown. Specifically, this can be realized for instance by making use of a cluster apparatus comprising a combination of a wet-type washing apparatus and a vacuum epitaxial growth apparatus.

Though these apparatuses are generally used, the abovementioned optimum conditions are not proposed yet.

Namely, first of all, the removal of the BMD with an HF aqueous solution and the washing of the silicon substrate 11a with an extra-super demineralized water are performed in the wet-type washing apparatus. Then, the silicon substrate 11a in the wet-type washing apparatus is transferred without being exposed to the air atmosphere to the vacuum epitaxial growth apparatus under conditions where the presence of contaminating materials (such as natural oxide film, organic contaminants, metallic impurities and etc.) is controlled to as minimum as possible.

Then, the epitaxial silicon film 14a is formed in the vacuum epitaxial growth apparatus. At this moment, since the contamination of the silicon substrate 11a is controlled as mentioned above, the silicon substrate 11a is no more required to be subjected to a dry cleaning treatment which may cause the etching of the silicon substrate 11a.

Figure 6:
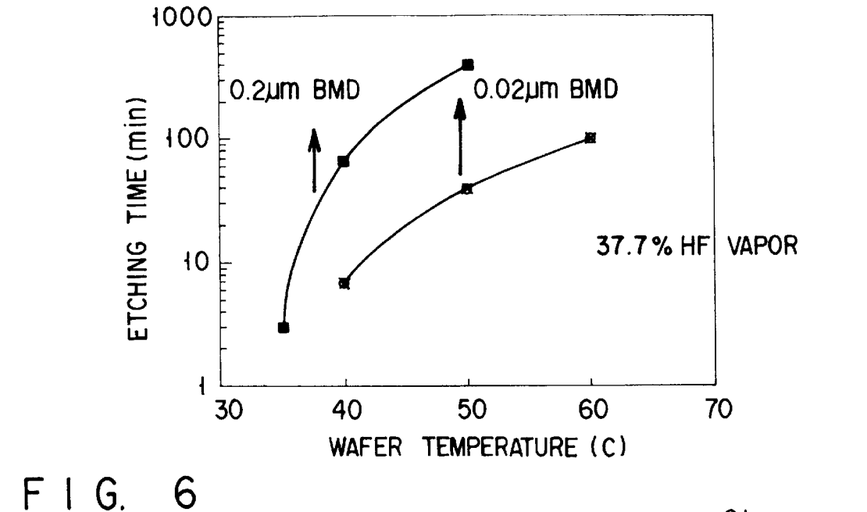
FIG. 6 is a graph showing a relationship between an etching temperature and an etching time, explaining etching conditions.

Instead of employing an HF aqueous solution, a gas atmosphere containing HF gas may be employed for the removal of the BMD. FIG. 6 illustrates one example of etching conditions (wafer temperature and etching time) for the removal of the BMD exposed on the surface of the substrate 11a by making use of an HF-steam mixed gas atmosphere of an azeotropic condition where water vapor is mixed in the HF gas.

It can be seen from FIG. 6 that when the temperature of the substrate is 35° C. and the size of the BMD is 0.2 μm, an etching treatment of 3 minutes or more is required. On the other hand, if the temperature of the substrate becomes 40° C. (or more in this case, an etching treatment of one hour or more is required. However, once the size of the BMD is reduced through a heat treatment under a high temperature to for example 0.02 μm, it is possible to completely remove the BMD exposed from the surface of the substrate by means of the etching not only by setting the temperature of the substrate to 35° C., but also by selecting the etching conditions which fall within the region existing upper than the borderline shown in FIG. 6.

When the BMD is removed by the employment of an HF aqueous solution, the surface of the silicon substrate (including both concaved regions formed by the removal of the BMD and flat regions) should desirably be subjected to a hydrogen terminalization treatment so as to stabilize the surface of the silicon substrate.

Although it is possible to perform the removal of the BMD by an etching treatment by making use of a mixed gas system comprising an HF gas mixed with water vapor as explained above, it is also possible to perform the removal of the BMD by a dry etching treatment by making use of anhydrous HF gas. In the latter case, the temperature should preferably be controlled to not more than 200° C., more preferably 100° C. or less so as to prevent the silicon substrate from being etched.

EXAMPLE 2

FIGS. 7A to 7D are cross-sectional views illustrating a process of treating a semiconductor substrate according to a second example of this invention.

Figure 7A:
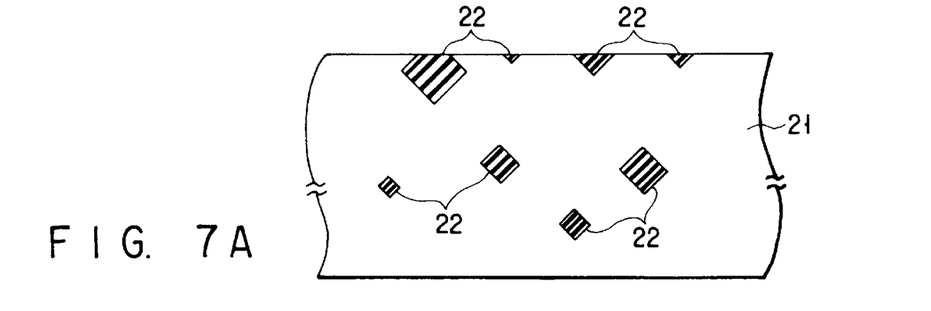
FIGS. 7A to 7D are cross-sectional views each explaining a process of treating a semiconductor substrate according to a second example of this invention.

First of all, as shown in FIG. 7A, a silicon substrate 21 is prepared from a silicon bulk having an oxygen concentration of about $1.3 \times 10^{18}$ to $1.5 \times 10^{18}$ atoms/cm$^3$ and manufactured by means of the Czochralski method. At this stage, the density of BMD 22 at the surface region of the silicon 21 is still as high as the conventional one.

Figure 7B:
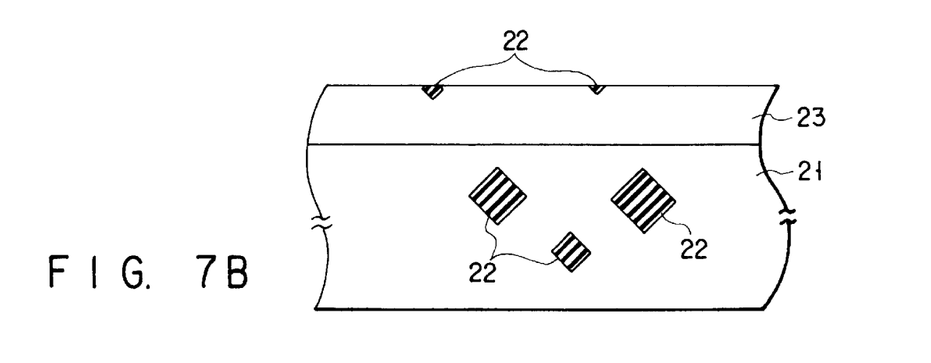

Then, as shown in FIG. 7B, the silicon 21 is subjected to an annealing treatment for two hours in a rare gas such as argon gas atmosphere at a temperature of 1,200° C., thereby forming a DZ layer 23 at a surface region extending from the surface of the silicon substrate 21 to a depth of about 20 μm. The conditions for this annealing are shown in FIG. 5. As seen from FIG. 5, if the silicon substrate is heat-treated at a high temperature in a non-oxygen atmosphere, the substrate will be etched. If the substrate is to be etched in this manner, a temperature of about 850° C. is required. Further, if the BMD in the surface region of the substrate is to be reduced in size to 0.1 μm or less, a treatment temperature of 1,000° C. or more is required.

The fundamental feature of the method according to this example resides in that the annealing of the silicon substrate is performed under a gas atmosphere where the partial pressure of oxygen is controlled to such a low degree that the oxidation of the silicon substrate can be avoided. Accordingly, the annealing may be either a normal pressure/high temperature annealing or a reduced pressure/high temperature annealing.

Figure 7C:
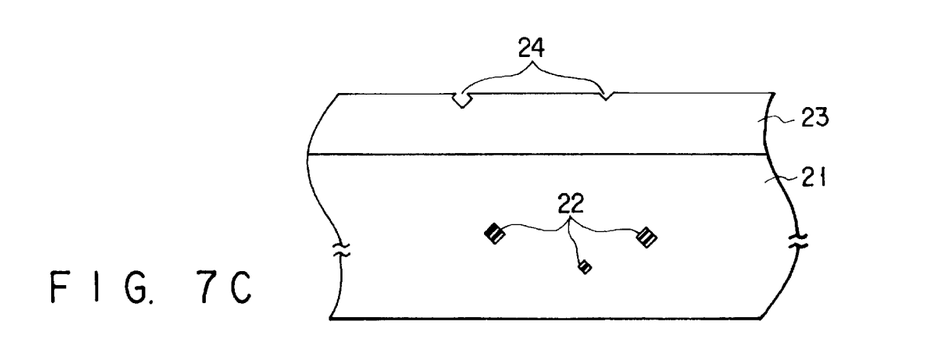

Then, the surface of the silicon 21 is subjected to an etching treatment for about 3 minutes by making use for instance of a 3% HF aqueous solution. At this moment, minute concaves 24 were observed on the surface of the silicon substrate 21 as shown in FIG. 7C.

Figure 8:
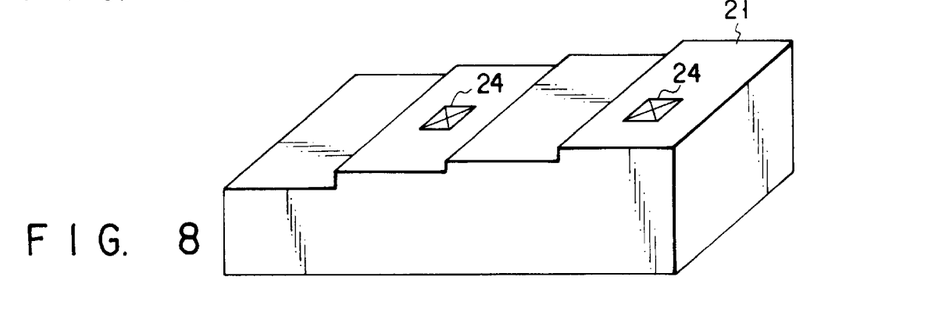
FIG. 8 is a perspective view showing minute concaves formed on the surface of the silicon substrate of FIG. 7A as observed with an atomic force microscope (AFM)

FIG. 8 illustrates the results when the minute concaves 24 were observed with an atomic force microscope (AFM). Namely, it has been found as a result of observation with the AFM that terraces and steps are formed on the surface of the silicon substrate 21 and that the concaves 24 formed therein have a diameter of about 8 to 10 nm and a depth of about 2 nm or more, the density of the concave 24 being about $1 \times 10^2$.

By the way, the maximum diameter of this concave 24 should desirably be controlled to 0.1 μm or less, more preferably 0.07 to 0.08 μm in view of subsequently forming an epitaxial silicon film which is excellent in flatness.

The DZ layer has been conventionally evaluated by means of a measuring apparatus such as a laser diffuser apparatus, or so-called a BMD analyzer. However, any defect has been failed to be found in this DZ layer so that this DZ layer has been conventionally considered as being a defect-free layer.

However, it has been made clear from the results of the AFM measurement conducted by the present inventors that minute BMDs which can be etched away by an HF aqueous solution are actually existed in the surface of the DZ layer.

Figure 7D:
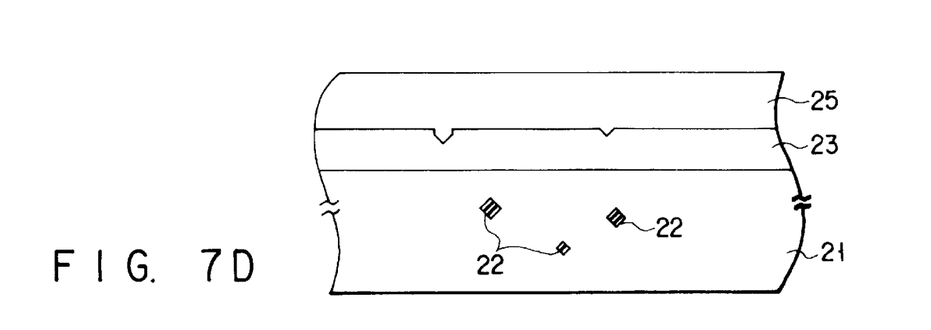
Figure 11:
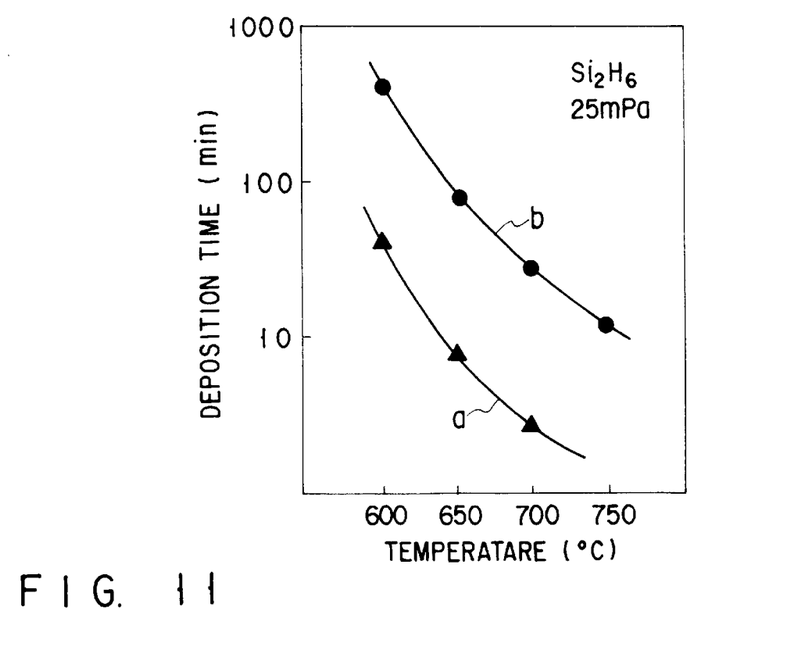
FIG. 11 is a graph showing a relationship between a temperature for an epitaxial growth and the time required for the epitaxial growth.

Then, as shown in FIG. 7D, an epitaxial silicon film 25 having a thickness of about 500 nm is formed on the surface of silicon substrate 21. The silicon film 25 is formed by a low pressure CVD at an atmosphere containing $Si_2H_6$ of partial pressure of 25 mPa. FIG. 11 is a graph showing a relationship between deposition temperature and deposition time for forming an epitaxial silicon film having a desired thickness. In FIG. 11, curve a shows a case of film thickness of 50 nm, and curve b shows a case of film thickness of 500 nm.

In this occasion, since the concave 24 is filled with silicon, the formation of a rugged surface of the epitaxial silicon film 25 can be avoided as in the case of Example 1, thus making it possible to obtain the epitaxial silicon film 14 having a flat surface.

Furthermore, since some of the BMDs will be vanished and the remainder of the BMDs will be reduced in size, the density of the BMDs becomes low and the size of the BMDs becomes smaller as a whole.

Moreover, since the size of the BMDs becomes smaller as mentioned above, the size of the concave 24 also becomes smaller as compared with that of the concave 13 of Example 1. Accordingly, the amount of silicon required for filling the concave 24 may be reduced, thereby making it easy to realize the thinning of the epitaxial silicon film 25 as compared with Example 1. That is, the epitaxial silicon film 25 can be thinned to a thickness of 50 nm or less, thereby shortening the process time.

Further, since the BMD becomes low in density and smaller in size, the time for the treatment with the HF aqueous solution can be shortened. For example, when a 3% HF aqueous solution is employed, the BMD can be removed within 2 to 3 minutes.

Finally, a silicon oxide film is formed on the surface of the epitaxial silicon film 25 to obtain a desired semiconductor device. According to this example, it is possible to obtain almost the same effects as obtained in Example 1.

Although details on the semiconductor device to be formed in the epitaxial silicon film 14 or 25 are not explained specifically in the aforementioned Examples 1 and 2, it should be noted that the advantages of this invention would be especially conspicuous when the silicon oxide film that has been formed on the surface of the epitaxial silicon film 14 or 25 is employed as a tunnel gate oxide film in an EEPROM.

This is because, in the case of this tunnel gate oxide film for an EEPROM, the tunnel gate oxide film is exposed to a Fowler-Nordheim type current stress of high electric field so that, in order to realize a high reliability, the tunnel gate oxide film is required to be free from both random failure and intrinsic failure.

As a matter of fact, it has been confirmed that the tunnel gate oxide film of EEPROM which has been formed by making use of a silicon substrate according to this invention has exhibited a higher reliability as compared with the tunnel gate oxide film which has been formed by making use of a silicon substrate according to the conventional technique.

Figure 9:
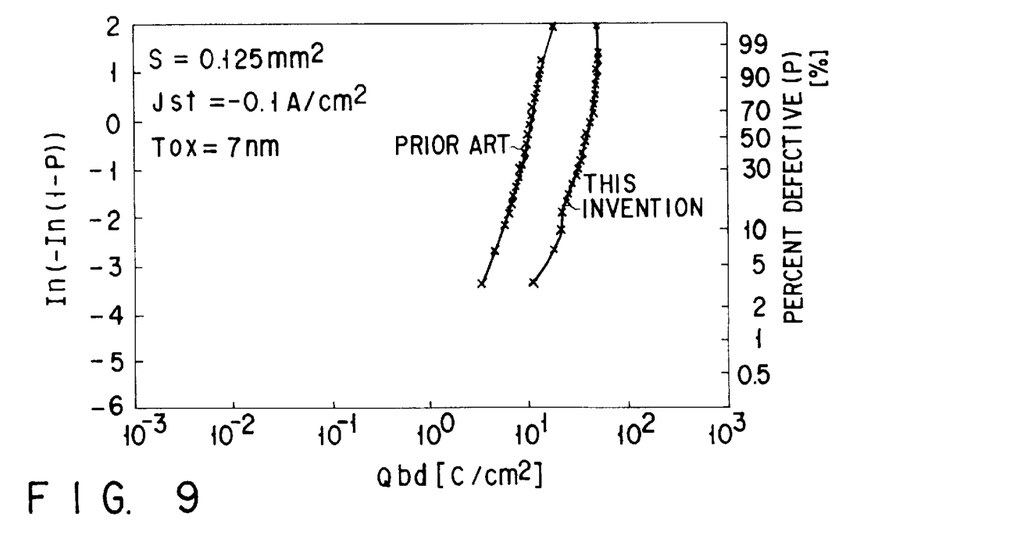
FIG. 9 is a graph showing a comparison in the charge to dielectric breakdown between a gate oxide film formed on a conventional silicon substrate and a gate oxide film formed on a silicon substrate which has been treated according to this invention.

Namely, a capacitor comprising a gate having an area $S=0.125$ mm$^2$ and an oxide film having a thickness Tox=7 nm was formed and then electrons were injected from a gate electrode under a stress current density of $Jst=0.1A/cm^2$ to measure the charge to dielectric breakdown (Qbd) of the capacitor under a constant current stress. As a result, results shown in FIG. 9 were obtained. As shown in FIG. 9, the tunnel gate oxide film according to this invention indicated a prominent improvement in Qbd as compared with the tunnel gate oxide films which have been formed on the conventional untreated DZ silicon substrate or on the conventional epitaxial silicon substrate.

Figure 10:
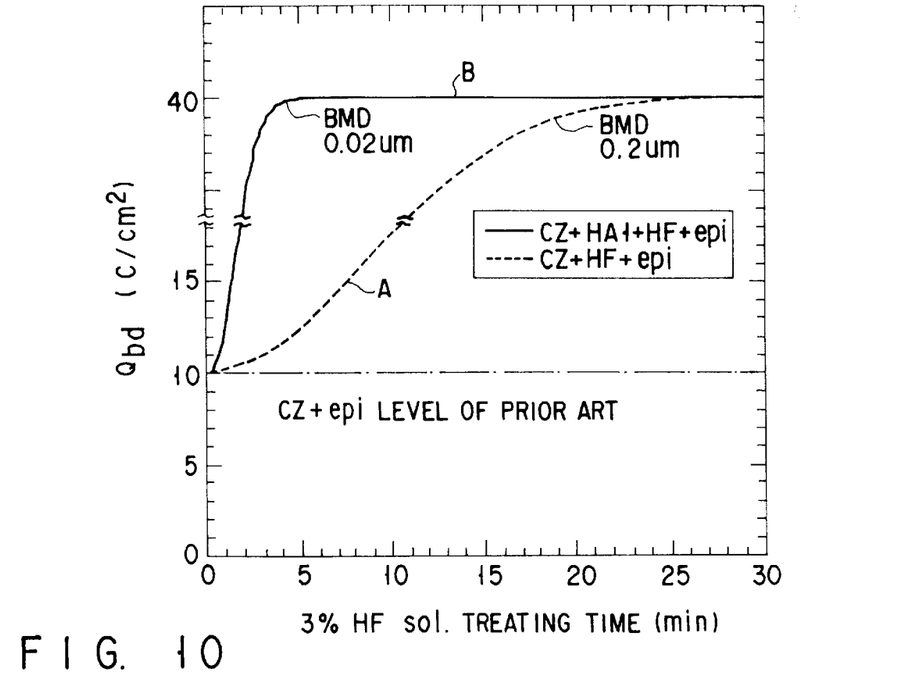
FIG. 10 is a graph showing a comparison in the charge to dielectric breakdown between a capacitor formed on a conventional silicon substrate and a capacitor formed on a silicon substrate which has been treated according to this invention.

FIG. 10 shows one example of comparison in Qbd among capacitors each formed on different kinds of substrates from each other. As shown in FIG. 10, there are three kinds of samples, i.e. a first sample is related to a case where a silicon layer is epitaxially grown on a conventional CZ silicon substrate, a second sample is related to a case where a CZ silicon substrate is first subjected to an HF treatment to completely remove the BMD existing in the surface portion of the silicon substrate, and then a silicon layer is epitaxially grown on the silicon substrate (Method A of this invention), and a third sample is related to a case where a CZ silicon substrate is first subjected to an annealing treatment in a non-oxidizing atmosphere at a high temperature of 1,000° C. or more, followed by an HF treatment to completely remove the BMD existing in the surface portion of the silicon substrate, and then a silicon layer is epitaxially grown on the silicon substrate (Method B of this invention). As seen from the results of this comparison, the latter two methods comprising the HF treatment for removing the BMD (Methods A and B) were found to be more excellent in Qbd as compared with the conventional method (the first sample).

When Method A is compared with Method B, since the size of BMD in the surface portion of the silicon substrate according to Method B is made smaller through the heat treatment as compared with Method A, it is possible according to Method B to further improve the properties of capacitor even with a short period of HF treatment as compared with those to be obtained by Method A. It is possible, even in the case of Method A where a temperature heat treatment is not performed, to improve the Qbd by removing the BMD through a long period of HF treatment.

As for the raw material gas to be employed in Examples 1 and 2 for the formation of the epitaxial silicon films 14 and 25, a gas containing trichlorosilane, dichlorosilane or monosilane as a main component can be employed.

If the temperature for forming the epitaxial silicon films 14 and 25 is as high as about 1,200° C., the migration of silicon atom would be caused simultaneously with the deposition of silicon atom so that any concave left remained in the surface of the silicon substrate is buried with silicon atom thereby making it possible to form a flat epitaxial silicon layer which is free from uneven surface, thus leaving only terraces and steps in the sense of atomic level.

Furthermore, it is also possible to form the epitaxial silicon films 14 and 25 at a temperature of as low as about 600° C. Since the flattening effect by the migration of silicon atom is relatively low in this case, it is desirable to perform an additional annealing at a temperature of 900° C. or more for promoting the migration.

Further, the step of forming the epitaxial silicon films 14 and 25 can be performed not only by means of vapor-phase growth, but also by epitaxially growing a silicon film after an amorphous silicon film is deposited in advance from a solid phase or a liquid phase growth.

Since the flattening effect by the migration of silicon atom is relatively low also in this case, it is desirable to perform an annealing at a temperature of 900° C. or more with a view to promote the migration, or to increase the annealing temperature in the epitaxial growth to as high as 900° C. or more.

As for the annealing atmosphere for forming the epitaxial silicon film, any kind of atmosphere can be employed as long as it is fundamentally free from impurities such as oxygen, carbon and water, i.e. the atmosphere may be vacuum or an atmospheric pressure gas atmosphere comprising a rare gas such as argon and helium, nitrogen or hydrogen.

In the above examples, an oxygen precipitate (BMD) has been exemplified as a precipitate exposed from a silicon substrate. However, this invention is also applicable to the cases where the precipitate is formed of metallic impurities or a metal silicide. Further, the precipitate may be the one which is protruded from the surface of the substrate.

According to the aforementioned examples, the method of this invention has been carried out in a process prior to the formation of a semiconductor device. However, the method of this invention can be also carried out in the course of forming a semiconductor device. For example, when a MOS transistor is to be formed, this invention can be carried out after an element isolating insulating layer is formed in a silicon substrate and immediately before a gate oxide film is formed. This invention can be exercised by modifying variously within the scope of this invention.

As explained above, it is possible according to this invention to effectively minimize the micro defects of the surface of the semiconductor substrate on which a semiconductor monocrystalline film is formed, and therefore to form an insulating film having an improved charge to dielectric breakdown of MOS capacitor on the surface of a semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of treating a semiconductor substrate, which comprises the steps of:

performing an etching treatment of a surface of the semiconductor substrate under a condition where the semiconductor substrate is substantially prevented from being etched and a precipitate exposed from the surface of the semiconductor substrate is selectively etched away to form concaves having a diameter of 0.2 to 0.5 µm on the surface of the semiconductor substrate; and forming a monocrystalline film of a semiconductor material constituting the semiconductor substrate on the surface of the semiconductor substrate.

2. The method of treating a semiconductor substrate according to claim 1, wherein said etching treatment is a treatment by making use of a dilute aqueous solution of hydrofluoric acid.

3. The method of treating a semiconductor substrate according to claim 1, wherein said etching treatment is a treatment by making use of a mixed gas atmosphere comprising an HF gas and water vapor.

4. The method of treating a semiconductor substrate according to claim 1, which further comprises a step of annealing treatment subsequent to the step of said etching treatment and prior to the step of forming a monocrystalline semiconductor film.

5. The method of treating a semiconductor substrate according to claim 4, wherein said step of annealing treatment is performed at a temperature of 850° C. or more and under a reduced pressure comprising an oxygen partial pressure of $2.0 \times 10^{12} \exp(-3.83/kT)$ or less.

6. The method of treating a semiconductor substrate according to claim 4, wherein said annealing treatment is performed at a temperature of 850° C. or more and under an atmospheric pressure of non-oxidizing atmosphere.

7. The method of treating a semiconductor substrate according to claim 6, wherein said non-oxidizing atmosphere consists of at least one kind of gas selected from the group consisting of hydrogen and an inert gas.

8. The method of treating a semiconductor substrate according to claim 7, wherein said inert gas is a rare gas.

9. A method of treating a semiconductor substrate, which comprises the steps of:

subjecting a surface of the semiconductor substrate to a first annealing treatment;

performing an etching treatment of a surface of the semiconductor substrate under a condition where the semiconductor substrate is substantially prevented from being etched and a precipitate exposed from the surface of the semiconductor substrate is selectively etched away to form concaves having a diameter of 0.2 to 0.5 µm on the surface of the semiconductor substrate; and forming a monocrystalline film of a semiconductor material constituting the semiconductor substrate on the surface of the semiconductor substrate.

10. The method of treating a semiconductor substrate according to claim 9, wherein said first annealing treatment is performed at a temperature of 850° C. or more and under an atmospheric pressure of non-oxidizing atmosphere.

11. The method of treating a semiconductor substrate according to claim 10, wherein said non-oxidizing atmosphere consists of at least one kind of gas selected from the group consisting of, hydrogen and an inert gas.

12. The method of treating a semiconductor substrate according to claim 11, wherein said inert gas is a rare gas.

13. The method of treating a semiconductor substrate according to claim 9, wherein said first annealing treatment is performed at a temperature of 850° C. or more and under a reduced pressure comprising an oxygen partial pressure of $2.0 \times 10^{12} \exp(-3.83/kT)$ or less.

14. The method of treating a semiconductor substrate according to claim 9, which further comprises a second annealing treatment which is performed after the step of said etching treatment and prior to the step of forming a semiconductor monocrystalline film.

15. The method of treating a semiconductor substrate according to claim 14, wherein said second annealing treatment is performed at a temperature of 850° C. or more and under a reduced pressure comprising an oxygen partial pressure of $2.0 \times 10^{12} \exp(-3.83/kT)$ or less.

16. The method of treating a semiconductor substrate according to claim 14, wherein said first annealing treatment is performed at a temperature of 850° C. or more and under an atmospheric pressure of non-oxidizing atmosphere.

17. The method of treating a semiconductor substrate according to claim 16, wherein said non-oxidizing atmosphere comprises at least one kind of gas selected from the group consisting of hydrogen and an inert gas.

18. The method of treating a semiconductor substrate according to claim 17, wherein said inert gas is a rare gas.

19. The method of treating a semiconductor substrate according to claim 1, wherein said monocrystalline film has a thickness of 50 nm or less.

* * * * *